(12) United States Patent
Kim et al.

(10) Patent No.: US 6,822,914 B2
(45) Date of Patent: Nov. 23, 2004

(54) CIRCUITS AND METHODS FOR GENERATING HIGH FREQUENCY EXTENDED TEST PATTERN DATA FROM LOW FREQUENCY TEST PATTERN DATA INPUT TO AN INTEGRATED CIRCUIT MEMORY DEVICE

(75) Inventors: Chang-sik Kim, Kyounggi-do (KR); Dong-ryul Ryu, Kyounggi-do (KR); Hyun-Dong Kim, Seoul (KR); Young-uk Chang, Kyounggi-do (KR); Seok-won Hwang, Seoul (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 10/459,741

(22) Filed: Jun. 12, 2003

(65) Prior Publication Data
US 2004/0100839 A1 May 27, 2004

(30) Foreign Application Priority Data
Nov. 25, 2002 (KR) .............................. 10-2002-0073358

(51) Int. Cl.$^7$ ................................................ G11C 7/00
(52) U.S. Cl. ....................................... 365/201; 365/233
(58) Field of Search ................................ 365/201, 233; 714/736

(56) References Cited

U.S. PATENT DOCUMENTS

| | | | |
|---|---|---|---|
| 6,058,056 A | * 5/2000 | Beffa et al. | 365/201 |
| 6,175,534 B1 | 1/2001 | Taniguchi et al. | 365/233 |
| 6,744,272 B2 | * 6/2004 | Ernst et al. | 324/765 |
| 6,754,866 B1 | * 6/2004 | Ong et al. | 714/736 |
| 2002/0073358 A1 | 6/2002 | Atkinson | 714/21 |
| 2002/0112283 A1 | * 8/2002 | Jansen | 4/434 |

\* cited by examiner

*Primary Examiner*—Vu A. Le
(74) *Attorney, Agent, or Firm*—Myers Bigel Sibley & Sajovec, P.A.

(57) ABSTRACT

An integrated circuit memory device includes a test pattern data generator circuit that is configured to generate an extended test pattern data based on test pattern data provided to the memory device during a test mode of the memory device and is configured to provide the extended test pattern data and the test pattern data during a test mode of the memory device. Related methods are also disclosed.

22 Claims, 2 Drawing Sheets

CIRCUITS AND METHODS FOR GENERATING HIGH FREQUENCY EXTENDED TEST PATTERN DATA FROM LOW FREQUENCY TEST PATTERN DATA INPUT TO AN INTEGRATED CIRCUIT MEMORY DEVICE

CLAIM FOR PRIORITY

This application claims priority to Korean Patent Application No. 10-2002-0073358, filed on Nov. 25, 2002, the entire contents of which are incorporated herein by reference.

FIELD OF THE INVENTION

The present invention generally relates to circuits and methods for operating integrated circuit memory devices and, more particularly, to circuits and methods for testing integrated circuit memory devices.

BACKGROUND

The manufacture of integrated circuit (semiconductor) memory devices generally includes testing the memory devices using an external tester. In testing a semiconductor memory device, a test pattern can be written to (and read back from) memory cells of the memory device to determine whether the memory cells are operating properly. If the data read from a memory cell is equal to the test pattern written to the memory cell, the memory cell is determined to be "good" whereas if the data read from the memory cell is not equal to the test pattern written to the memory cell, the memory cell is determined to be "defective."

Generally, it is preferable for "high speed" memory devices to be tested using a high frequency clock, but the cost of a high frequency crystal oscillator used to generate the high frequency clock signal may be prohibitive.

It is known to test high speed memory devices using a "low frequency tester" that provides low frequency clock signals to the memory device. In this conventional approach, two pins of the memory device to be tested are dedicated to receiving two low frequency clock signals generated by the low frequency tester. The two low frequency clocks can be out of phase by about 90° which can be combined to create a high frequency clock internal to the memory device. However, in some cases, such as in the case where the number of input/output (IO) is as many as X32, it may be difficult to dedicate these pins to receiving the clock. In particular, a memory device that requires many signals, data, etc. for operation may be "pin limited" such that all of the pins of the device are already required for other operations. Furthermore, if the tester is required to provide all these control, data, etc. signals for operation of the memory device, it may be difficult for the tester to provide all of the control, data, etc. in addition to the multiple clocks that may also be required, which may affect productivity and cost of operating the tester.

SUMMARY

Embodiments according to the invention can provide high frequency integrated circuit memory devices that can be tested using low frequency testers. Pursuant to these embodiments, an integrated circuit memory device can include a test pattern data generator circuit that is configured to generate an extended test pattern data based on test pattern data provided to the memory device during a test mode of the memory device and configured to provide the extended test pattern data and the test pattern data during a test mode of the memory device.

In some embodiments according to the present invention, the test pattern data generator circuit can include a first test pattern data generator circuit and a second test pattern data generator circuit that is configured to generate second extended test pattern data based on second test pattern data provided to the memory device during the test mode. An output buffer circuit can be configured to output the first test pattern data, the first extended test pattern data, the second test pattern data, and the second extended test pattern data.

In some embodiments according to the present invention, the output buffer circuit can be configured to output the first test pattern data, the first extended test pattern data, the second test pattern data, and the second extended test pattern data serially in time synchronous with a clock having a frequency that is greater than a frequency at which the first and second test pattern data are provided to the memory device.

In some embodiments according to the present invention, the test pattern data is provided to the memory device at a first frequency and the extended test pattern data and the test pattern data are output serially in time at a second frequency that is greater than the first frequency. In some embodiments according to the present invention, the test pattern data generator circuit generates the extended test pattern data by at least one of replicating the test pattern data, inverting the test pattern data, and randomizing the test pattern data.

In some embodiments according to the present invention, the test pattern generator circuit can include a first transmission gate configured to selectively output the test pattern data in response to a mode register set signal associated with the test mode based on a state of an inverted mode register set signal electrically connected thereto. A first inverter circuit can be configured to invert the test pattern data to provide inverted test pattern data. A second transmission gate can be configured to selectively output the inverted test pattern data based on the state of the mode register set signal. A second inverter circuit can be configured to invert the mode register set signal to provide the inverted mode register set signal that is electrically connected to the first transmission gate.

In other embodiments according to the present invention, methods of generating extended test data in an integrated circuit memory device can include generating an extended test pattern data based on test pattern data provided to the memory device during a test mode of the memory device and providing the extended test pattern data and the test pattern data during a test mode of the memory device.

DESCRIPTION OF EMBODIMENTS ACCORDING TO THE INVENTION

The invention now will be described more fully hereinafter with reference to the accompanying drawings, in which embodiments according to the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that although the terms first and second are used herein to describe various elements, the elements are not limited by these terms. These terms are used to distinguish one element from another element. Thus, a first element discussed below could be termed a second element, and similarly, a second element may be termed a first element without departing from the teachings of the invention. It will also be understood that when an element such as a circuit, is referred to as being "connected" or "electrically connected" to another element, it can be directly connected to the other element or intervening elements may also be present. Like numbers refer to like elements throughout.

The terminology used herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. Unless otherwise defined, all technical and scientific terms used herein have the same meaning as commonly understood by one of ordinary skill in the art to which this invention belongs.

As will be appreciated by one of skill in the art, the present invention may be embodied as methods and/or circuits. It will be understood that each block of the block diagrams, and combinations of blocks, can illustrate exemplary method embodiments according to the invention as well as circuit embodiments. Similarly, the timing diagram can illustrate exemplary method embodiments according to the invention. It will be understood that, although the timing diagram illustrates a particular sequence of events, embodiments according to the invention can operate using other sequences.

Figure 1:
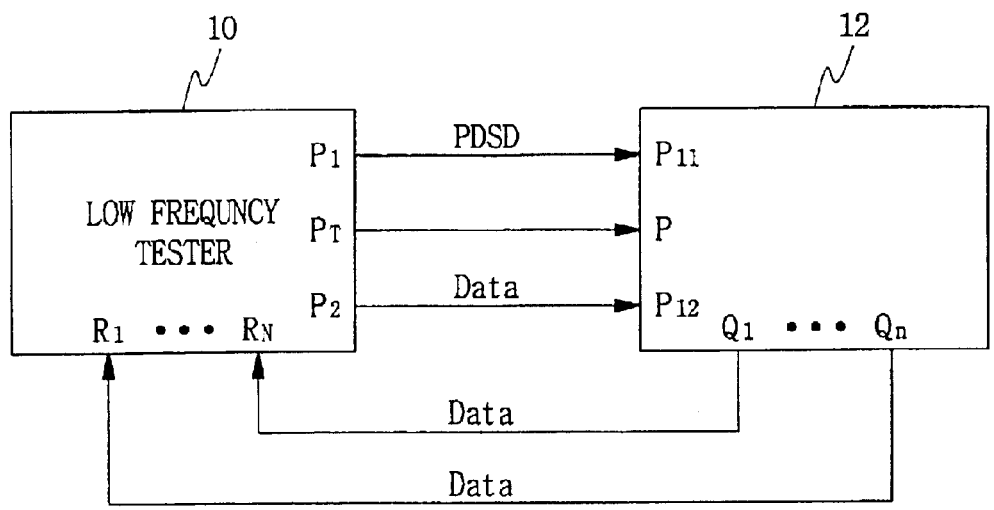
FIG. 1 is a block diagram that illustrates embodiments of low frequency testers and a Device Under Test (DUT) according to the invention.

FIG. 1 illustrates low frequency tester embodiments according to the invention and a DUT (Device Under Test). Referring to FIG. 1, a test clock signal PDSD is provided to a test clock input pin $P_{11}$ of the DUT 12 from a clock output pin $P_1$ of the low frequency tester 10. Data is provided to a data input pin $P_{12}$ of the DUT 12 from a data output pin $P_2$ of the low frequency tester 10. A test mode signal is provided from a test mode output pin $P_T$ on the low frequency tester 10 to a test mode input pin P on the DUT 12. Data from the DUT 12 is output on a plurality of data output pins $Q_1$~$Q_n$ of the DUT 12 which are connected to a plurality of data input pins $R_1$~$R_n$ on the low frequency tester 10.

The low frequency tester 10 outputs the low frequency clock signal PDSD, through the clock output pin $P_1$, and outputs test pattern data through the data output pin $P_2$ synchronous with the low frequency clock signal PDSD. The DUT 12 receives the clock signal PDSD via the clock input pin $P_{11}$ and receives the test data (in this case "test pattern data") via the data input pin $P_{12}$. In some embodiments according to the invention, the test data is used to generate extended test pattern data based on test pattern data provided to the memory device during a test mode of the memory device. The extended test pattern data and the test pattern data are provided to the memory device by the tester and are output to the memory during a test mode of the memory device synchronous with a high frequency clock signal PCLK used in the DUT 12. The memory is read and the data is output through the plurality of data output pins Q1~Qn.

The low frequency tester 10 compares the data received via the data input pins R1~Rn with the test pattern data written to the memory to determine the result of the test. In some embodiments according to the invention, the DUT 12 is an integrated circuit memory device operating using a high frequency clock of about 1 GHz.

Figure 2:
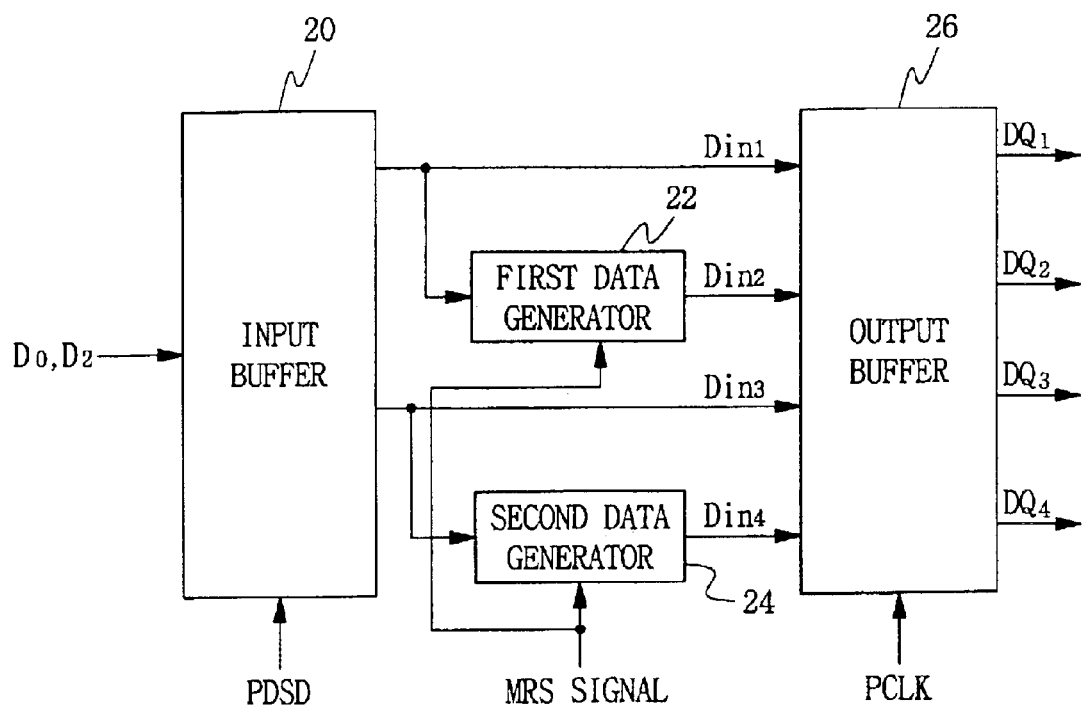
FIG. 2 is a block diagram that illustrates embodiments of data extension circuits in an integrated circuit memory device according to the invention.

FIG. 2 illustrates embodiments of data extension circuits in an integrated circuit memory device according to the invention. As shown in FIG. 2, a data extension circuit includes an input buffer circuit 20 for receiving and buffering a plurality of data $D_0$, $D_2$ provided by the low frequency tester 10 synchronous with the low frequency clock signal PDSD provided by the low frequency tester 10. The input buffer circuit 20 outputs data $D_0$, $D_2$ as test data $D_{IN1}$, $D_{IN3}$ respectively. $D_{IN1}$, $D_{IN3}$ are also provided to first and second data generators circuits 22, 24 respectively. Test data $D_{IN1}$, $D_{IN3}$ are used to generate extended test pattern data $D_{IN2}$, $D_{IN4}$ in response to a Mode Register Set (MRS) signal that indicates that a test mode of the memory device is active. An output buffer 26 buffers and outputs the plurality of test data $D_{IN1}$, $D_{IN3}$ provided by the input buffer 20 and buffers and outputs the extended test pattern data $D_{IN2}$, $D_{IN4}$ generated by the first and second data generators circuits 22, 24, synchronous with the internal high frequency clock signal PCLK to provide an entire extended test pattern data $D_{IN1}$-$D_{IN4}$.

Figure 3:
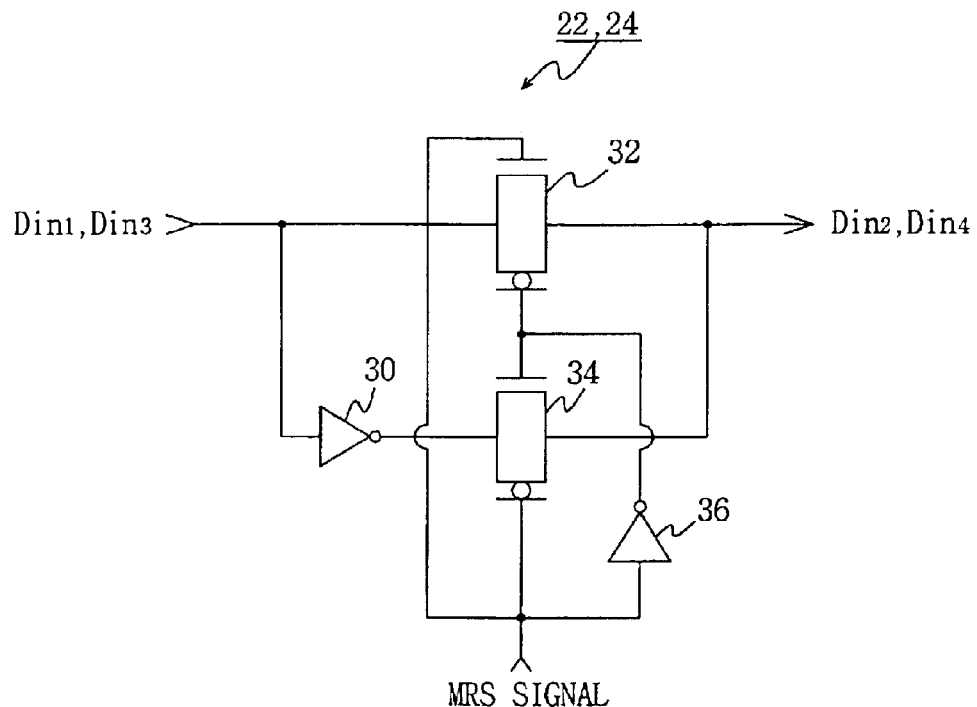
FIG. 3 is a circuit diagram illustrating embodiments of first and second data generators according to the invention.

FIG. 3 is a circuit schematic that illustrates embodiments of first and second data generators circuits according to the invention. Referring to FIG. 3, first and second data generators circuits 22, 24 respectively include a first transmission gate 32 that selectively outputs data from the input buffer circuit 20 in response to the MRS signal. A first inverter circuit 30 inverts the data provided by the input buffer circuit 20. A second transmission gate 34 selectively outputs the inverted data from the first inverter 30 in response to the MRS signal. A second inverter circuit 36 inverts the MRS signal so as to apply an inverted version of the MRS signal to a gate terminal of a PMOS transistor included in the first transmission gate 32 and a gate terminal of an NMOS transistor of the second transmission gate 34.

Figure 4:
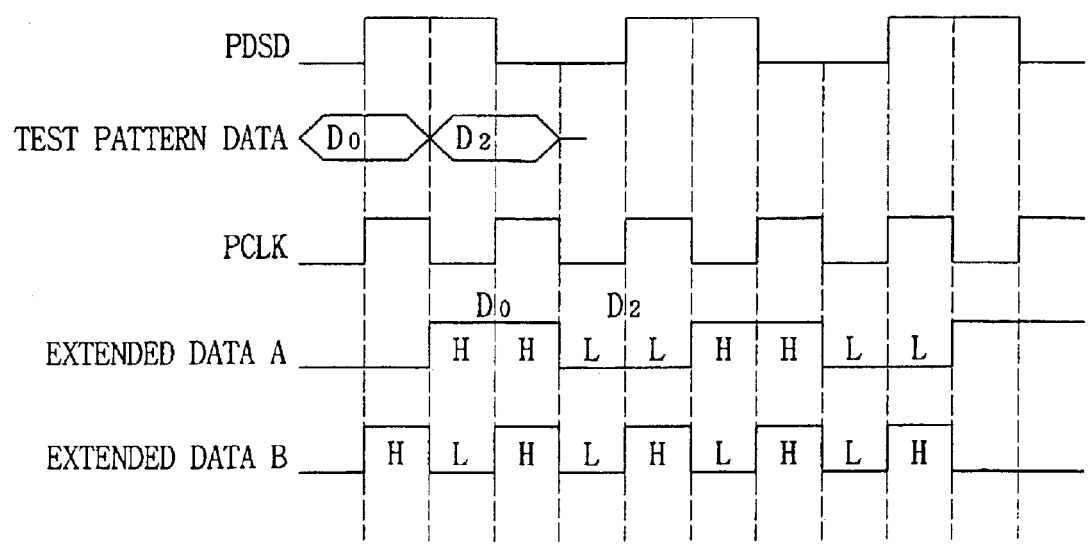
FIG. 4 is a timing drawing that illustrates method embodiments of operations of data extension circuits according to the invention.

FIG. 4 is a timing drawing that illustrates method embodiments of data extension circuits according to the invention. Referring to FIGS. 1 through 4, a test data pattern provided by a low frequency tester is extended for use with a high frequency clock signal in an integrated circuit memory device.

Describing the operations in detail, in some embodiments according to the invention, the low frequency clock signal PDSD generated by the low frequency tester 10 can have a frequency in a range between about 350 MHz and about 500 MHz and the high frequency clock signal PCLK used in the DUT 12 can be about twice the frequency of low frequency clock signal PDSD.

The low frequency tester 10 outputs two test pattern data $D_0$, $D_2$ every cycle of the low frequency clock signal PDSD to the DUT 12. The test pattern data $D_0$, $D_2$ is extended (to provide extended test pattern data including $D_0$, $D_1$, $D_2$, and $D_4$) by the data extension circuit of FIG. 2 in the integrated circuit memory device. The extended test pattern data is written/read into/from the memory array (included in the memory device) using the internal high frequency clock signal PCLK.

In operations of the data extension circuit of FIG. 2, the input buffer circuit 20 buffers and outputs the test data $D_0$, $D_2$ as test pattern data $D_{IN1}$, $D_{IN3}$ respectively as shown in FIG. 4, synchronous with every edge of the low frequency clock signal PDSD. The test pattern data $D_{IN1}$, $D_{IN3}$ is provided to the output buffer circuit 26 and to the first and second data generator circuits 22, 24.

The first and second data generator circuits 22, 24 generate extended test pattern data $D_{IN2}$, $D_{IN4}$ respectively by inverting or non-inverting the test pattern data $D_{IN1}$, $D_{IN3}$ in response to the MRS signal. For example, when the MRS signal is logical high (H), the test pattern data $D_{IN1}$, $D_{IN3}$ is replicated to provide the extended test pattern data $D_{IN2}$, $D_{IN4}$. When the MRS signal is logical low (L), the test pattern data $D_{IN1}$, $D_{IN3}$ are inverted to provide the extended test pattern data $D_{IN2}$, $D_{IN4}$.

Referring to FIG. 3, the operations of the first and second data generator circuits 22, 24 will be described in greater detail. When the MRS signal is H, the first transmission gate 32 is enabled and the second transmission gate 34 is disabled, thereby allowing the first transmission gate 32 to replicate $D_{IN1}$, $D_{IN3}$ to provided the extended test pattern data $D_{IN2}$, $D_{IN4}$. In particular, the MRS signal (H) turns-on an NMOS transistor in the first transmission gate 32 and the inverted MRS signal turns-on a PMOS transistor in the first transmission gate 32. The NMRS signal (H) also turns-off both an NMOS and a PMOS transistor in the second transmission gate 34 thereby preventing inverted $D_{IN1}$, $D_{IN3}$ from being output.

For example, when the MRS signal is high, and the test pattern data $D_0$ is high and the test pattern data $D_2$ is low, the first transmission gate 32 is enabled and the second transmission gate 34 is disabled. Therefore, the test data $D_{IN1}$ is output as a logic high signal through the first transmission gate 32 of the first data generator 22, and the test data $D_{IN3}$ is output as a low signal through the first transmission gate 32 of the second data generator 24. Thus, in this example, the extended test pattern data $D_{IN2}$, $D_{IN4}$ are the same as $D_{IN1}$, $D_{IN3}$ (i.e., logic high and low respectively), which are provided to the output buffer circuit 26 along with $D_{IN1}$, $D_{IN3}$.

Alternatively, MRS signal (L) turns-off the NMOS and PMOS transistors in the first transmission gate 32. The MRS signal (L) also turns-on the PMOS and the NMOS transistor in the second transmission gate 34 thereby enabling inverted $D_{IN1}$, $D_{IN3}$ to provide the extended test pattern data $D_{IN2}$, $D_{IN4}$. For example, when the MRS signal is low and the test pattern data $D_{IN1}$ is low and $D_{IN3}$ is high, the second transmission gate 34 is enabled and the first transmission gate 32 is disabled, thereby allowing inverted $D_{IN1}$, $D_{IN3}$ (via the inverter circuit 30) to be output as the extended test pattern data $D_{IN2}$, $D_{IN4}$ as a logic high and low respectively. The output buffer circuit 26 buffers and outputs the extended test pattern data B $D_{IN1}$–$D_{IN4}$ as shown in FIG. 4 synchronous with the internal clock signal PCLK, which can be twice the low frequency clock signal PDSD.

It will be further understood that in other embodiments according to the invention, the first and second data generator circuits 22, 24 can randomize the test pattern data $D_{IN1}$, $D_{IN3}$ to generate extended test pattern data $D_{IN1}$-$D_{IN4}$.

The extended test pattern data $D_{IN1}$–$D_{IN4}$ is output to the DUT 12, and is written to and read from the DUT 12 using the high frequency clock signal PCLK. The data read from the memory is output to the low frequency tester 10, which outputs a test result. Accordingly, embodiments according to the invention may allow the low frequency tester 10 to execute twice as many tests by classifying the data into odd number data and even number data when reading the test result data in response to the low frequency clock signal PDSD. Therefore the DUT 12 operating with the high frequency clock signal PCLK can be tested by the low frequency tester 10 that generates the low frequency clock signal PDSD. As shown in FIG. 4, the extended test pattern data $D_{IN1}$-$D_{IN4}$ are output serially in time synchronous with the edges of the high frequency clock signal PCLK.

Although the present invention has been described in reference to embodiments of the invention utilizing exemplary clock frequencies, it will be understood that other frequencies can be used. For example, in some embodiments according to the invention, data $D_0$ and $D_2$ can be provided to the memory device using a low frequency clock signal of 500 MHz provided by the low frequency tester 10. The two data $D_0$ and $D_2$ can be extended to four data ($D_0$–$D_4$) by the memory device using a 1 GHz clock. In some embodiments, a clock signal of over 1 GHz can be generated by the low frequency tester 10 and the test result data can be output from the memory device using a clock frequency over 2 GHz.

As described above, in embodiments according to the invention, a plurality of data generated from a low frequency tester can be extended to provide additional data which need not be transferred from the low frequency tester. The extended data can be used to provide additional data to test the memory device at higher frequencies.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device comprising:
 a test pattern data generator circuit configured to generate an extended test pattern data based on test pattern data provided to the memory device during a test mode of the memory device and to provide the extended test pattern data and the test pattern data during a test mode of the memory device.

2. An integrated circuit memory device according to claim 1 wherein the test pattern data generator circuit comprises a first test pattern data generator circuit, the memory device further comprising:
 a second test pattern data generator circuit configured to generate second extended test pattern data based on second test pattern data provided to the memory device during the test mode; and
 an output buffer circuit configured to output the first test pattern data, the first extended test pattern data, the second test pattern data, and the second extended test pattern data.

3. An integrated circuit memory device according to claim 2 wherein the output buffer circuit is configured to output the first test pattern data, the first extended test pattern data, the second test pattern data, and the second extended test pattern data serially in time synchronous with a clock having a frequency that is greater than a frequency at which the first and second test pattern data are provided to the memory device.

4. An integrated circuit memory device according to claim 1 wherein the test pattern data is provided to the memory device at a first frequency and the extended test pattern data and the test pattern data are output serially in time at a second frequency that is greater than the first frequency.

5. An integrated circuit memory device according to claim 1 wherein the test pattern data generator circuit generates the extended test pattern data by at least one of replicating the test pattern data, inverting the test pattern data, and randomizing the test pattern data.

6. An integrated circuit memory device according to claim 1 wherein the test pattern generator circuit comprises:
 a first transmission gate configured to selectively output the test pattern data in response to a mode register set signal associated with the test mode based on a state of an inverted mode register set signal electrically connected thereto;
 a first inverter circuit configured to invert the test pattern data to provide inverted test pattern data;
 a second transmission gate configured to selectively output the inverted test pattern data based on the state of the mode register set signal; and a second inverter circuit configured to invert the mode register set signal to provide the inverted mode register set signal that is electrically connected to the first transmission gate.

7. An integrated circuit memory device according to claim 2 wherein the first test pattern data, the first extended test pattern data, the second test pattern data, and the second extended test pattern data are provided serially in time from the output buffer to provide an extended test pattern data stream wherein the extended test pattern data included in the data stream toggles between logical high and logical low values.

8. An integrated circuit memory device according to claim 7 wherein the extended test pattern data included in the data stream switch between logical values synchronous with both edges of a clock signal internal to the memory device.

9. An integrated circuit memory device according to claim 7 wherein the extended test pattern data included in the data stream switch between logical values synchronous with only one of the edges of the clock signal.

10. A circuit for extending data in a semiconductor memory device capable of performing a high speed test in a low frequency tester, said circuit comprising:
   an input buffer for receiving a plurality of test pattern data provided from the low frequency tester in a unit of one cycle of a low frequency clock signal provided from the low frequency tester, and buffering and outputting the data;
   first and second data generators for respectively receiving the plurality of data outputted from the input buffer, and individually generating virtual data in response to a control signal; and
   an output buffer for buffering and outputting the plurality of test pattern data outputted from the input buffer and the virtual data generated from the first and second data generators in response to an internal high frequency clock signal.

11. The circuit of claim 10, wherein said control signal is a mode register set signal.

12. The circuit of claim 10, wherein said first and second data generators comprises:
   a first transmission gate for selectively outputting the data outputted from the input buffer in response to the mode register set signal;
   a first inverter for inverting and outputting the data outputted from the input buffer;
   a second transmission gate for selectively outputting the data inverted and outputted from the first inverter in response to the mode register set signal; and
   a second inverter for inverting the mode register set signal, and applying simultaneously the signal to gates of a PMOS transistor of the first transmission gate and an NMOS transistor of the second transmission gate.

13. A method of generating extended test data in an integrated circuit memory device comprising:
   generating an extended test pattern data based on test pattern data provided to the memory device during a test mode of the memory device; and
   providing the extended test pattern data and the test pattern data during a test mode of the memory device.

14. A method according to claim 13 further comprising:
   generating second extended test pattern data based on second test pattern data provided to the memory device during the test mode; and
   outputting the first test pattern data, the first extended test pattern data, the second test pattern data, and the second extended test pattern data.

15. A method according to claim 14 wherein the outputting step comprises outputting the first test pattern data, the first extended test pattern data, the second test pattern data, and the second extended test pattern data serially in time synchronous with a clock having a frequency that is greater than a frequency at which the first and second test pattern data are provided to the memory device.

16. A method according to claim 13 wherein the test pattern data is provided to the memory device at a first frequency and the extended test pattern data and the test pattern data are output serially in time at a second frequency that is greater than the first frequency.

17. A method according to claim 13 wherein the step of generating comprises at least one of replicating the test pattern data, inverting the test pattern data, and randomizing the test pattern data.

18. A method according to claim 14 wherein the step of outputting comprises the step of:
   outputting the first test pattern data, the first extended test pattern data, the second test pattern data, and the second extended test pattern data serially in time from an output buffer circuit to provide an extended test pattern data stream wherein the extended test pattern data included in the data stream toggles between logical high and logical low values.

19. A method according to claim 18 wherein the extended test pattern data included in the data stream switch between logical values synchronous with both edges of a clock signal internal to the memory device.

20. A method according to claim 18 wherein the extended test pattern data included in the data stream switch between logical values synchronous with only one of the edges of the clock signal.

21. A method of extending data in a semiconductor memory device capable of executing a high speed test in a low frequency tester, said method comprising the steps of:
   buffering and outputting a plurality of test pattern data every one cycle of a low frequency clock signal generated in the low frequency tester;
   generating, each one more, the plurality of buffered and outputted data, and then outputting a plurality of virtual data; and
   buffering the plurality of buffered and outputted data and the plurality of generated virtual data synchronously to an internal clock of the semiconductor memory device, and then outputting, by the multiple number of 2, extended data for the plurality of test pattern data.

22. The method of claim 21, further comprising the step of performing a test by classifying the data into odd data and even data through the low frequency clock signal, in reading test result data in the low frequency tester after writing and reading the extended data on/from the semiconductor memory device.

* * * * *